US012666529B2

(12) United States Patent
Nukui et al.

(10) Patent No.: US 12,666,529 B2
(45) Date of Patent: Jun. 23, 2026

(54) EXTERNAL CONNECTION TERMINAL

(71) Applicant: FUJIFILM Corporation, Tokyo (JP)

(72) Inventors: Katsuyuki Nukui, Kanagawa (JP); Kazuhiro Hasegawa, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 274 days.

(21) Appl. No.: 18/514,628

(22) Filed: Nov. 20, 2023

(65) Prior Publication Data

US 2024/0196522 A1 Jun. 13, 2024

(30) Foreign Application Priority Data

Nov. 28, 2022 (JP) ................................ 2022-189050

(51) Int. Cl.

*H05K 1/00* (2006.01)
*H05K 1/02* (2006.01)
*H05K 1/11* (2006.01)
*G06F 3/041* (2006.01)
*G06F 3/044* (2006.01)

(52) U.S. Cl.

CPC ........... *H05K 1/0254* (2013.01); *H05K 1/118* (2013.01); *G06F 3/04164* (2019.05); *G06F 3/0446* (2019.05)

(58) Field of Classification Search

CPC .... H05K 1/0254; H05K 1/118; G06F 3/0446; G06F 3/04164
See application file for complete search history.

(56) References Cited

U.S. PATENT DOCUMENTS

2005/0184313 A1* 8/2005 Han ..................... H05K 1/0259 257/200
2009/0050969 A1* 2/2009 Takasu .................... H01L 24/05 257/360
2012/0045910 A1* 2/2012 Kim ....................... H01R 43/24 29/842

FOREIGN PATENT DOCUMENTS

JP 2013-045246 A 3/2013

* cited by examiner

*Primary Examiner* — Pete T Lee
(74) *Attorney, Agent, or Firm* — Edwards Neils LLC; Jean C. Edwards, Esq.

(57) ABSTRACT

An external connection terminal capable of suppressing spark failure. The external connection terminal includes: a conduction portion that is electrically connected to an electronic circuit; and a non-conduction portion that is electrically insulated from the electronic circuit, in which the conduction portion and the non-conduction portion consist of a material including metal, and a ratio x of an occupied area of the non-conduction portion to an occupied area of the conduction portion in a plan view and a ratio y of a height of the non-conduction portion to a height of the conduction portion simultaneously satisfy $x \geq 0.30$, $y \geq 1.00$, and $y \geq -0.50 \times x + 1.25$.

6 Claims, 7 Drawing Sheets

EXTERNAL CONNECTION TERMINAL

CROSS-REFERENCE TO RELATED APPLICATIONS

The present application claims priority under 35 U.S.C. § 119 to Japanese Patent Application No. 2022-189050, filed on Nov. 28, 2022. The above application is hereby expressly incorporated by reference, in its entirety, into the present application.

BACKGROUND OF THE INVENTION

1. Field of the Invention

The present invention relates to an external connection terminal through which an electronic circuit on a substrate is electrically connected to an external apparatus.

2. Description of the Related Art

In the related art, in order to electrically connect an electronic circuit formed on a substrate to an external apparatus, for example, as disclosed in JP2013-045246A, the external connection terminal is connected to the electronic circuit in many cases.

SUMMARY OF THE INVENTION

Incidentally, in a case where the electronic circuit and the external connection terminal are formed on a sheet-like substrate, the sheet-like substrate is wound around a so-called roller or a plurality of sheet-like substrates overlap each other such that the sheet-like substrate may overlap the external connection terminal. In a case where the sheet-like substrates are peeled off from each other in this state, so-called peeling charging occurs such that so-called spark failure may occur in the external connection terminal.

The present invention has been made in order to solve the above-described problems, and an object thereof is to provide an external connection terminal capable of suppressing spark failure.

The above object can be achieved by the following configuration.

[1] An external connection terminal comprising:

a conduction portion that is electrically connected to an electronic circuit; and a non-conduction portion that is electrically insulated from the electronic circuit, in which the conduction portion and the non-conduction portion consist of a material including metal, and a ratio x of an occupied area of the non-conduction portion to an occupied area of the conduction portion in a plan view and a ratio y of a height of the non-conduction portion to a height of the conduction portion simultaneously satisfy $$x \geq 0.30,$$

$$y \geq 1.00, \text{ and}$$

$$y \geq -0.50 \times x + 1.25.$$

[2] The external connection terminal according to [1], in which the ratio x and the ratio y simultaneously satisfy $$x \geq 0.75,$$

$$y \geq 1.00, \text{ and}$$

$$y \geq -0.50 \times x + 1.675.$$

[3] The external connection terminal according to [1] or [2], in which the non-conduction portion consists of at least one pattern.

[4] The external connection terminal according to [3], in which the at least one pattern of the non-conduction portion is surrounded by the conduction portion.

Since the external connection terminal according to the present invention includes a conduction portion that is electrically connected to an electronic circuit and a non-conduction portion that is electrically insulated from the electronic circuit, the conduction portion and the non-conduction portion consist of a material including metal, and a ratio x of an occupied area of the non-conduction portion to an occupied area of the conduction portion in a plan view and a ratio y of a height of the non-conduction portion to a height of the conduction portion simultaneously satisfy $x \geq 0.3$, $y \geq 1.0$, and $y \geq -0.5 \times x + 1.25$, spark failure can be suppressed.

DESCRIPTION OF THE PREFERRED EMBODIMENTS

Hereinafter, a conductive member according to the present invention will be described in detail based on a preferred embodiment shown in the accompanying drawings.

The drawings described below are exemplary drawings for describing the present invention, and the present invention is not limited to the drawings described below.

In the following description, a numerical range indicated by the expression "to" includes numerical values described on both sides. For example, in a case where ε is a numerical value α to a numerical value β, the range ε is a range including the numerical value α and the numerical value β, which is expressed by a mathematical symbol a $\alpha \geq \varepsilon \geq \beta$.

Unless specified otherwise, the meaning of an angle such as "parallel" or "orthogonal" includes a case where an error range is generally allowable in the technical field.

In addition, the meaning of "the same" includes a case where an error range is generally allowable in the technical field.

In this specification, "(meth)acrylate" denotes either or both of acrylate and methacrylate, and "(meth)acryl" denotes either or both of acryl and methacryl. In addition, "(meth)acryloyl" denotes either or both of acryloyl and methacryloyl.

Unless specified otherwise, being transparent with respect to visible light represents that a visible light transmittance in a visible wavelength range of 380 nm to 800 nm is 40% or more, preferably 80.0% or more, and more preferably 90.0% or more. In the following description, unless specified otherwise, being transparent represents being transparent with respect to visible light.

The visible light transmittance is measured using "Plastics—Determination of Total Luminous Transmittance and Reflectance" defined by Japanese Industrial Standards (JIS) K 7375:2008.

EMBODIMENT

Figure 1:
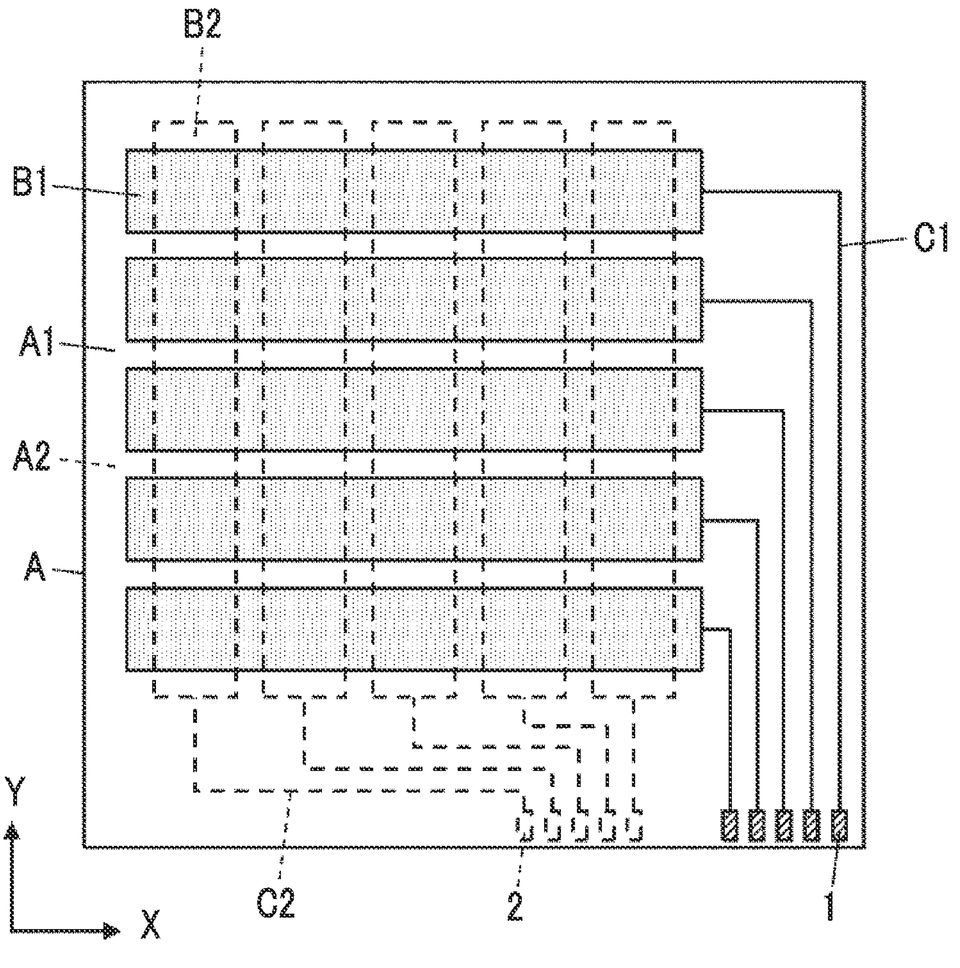
FIG. 1 is a plan view showing a touch panel according to an embodiment of the present invention.

FIG. 1 shows a configuration of a touch panel according to an embodiment of the present invention.

The touch panel includes an insulating and sheet-like substrate A having a planar shape along an XY plane. The substrate A includes a first surface A1 and a second substrate A2 forming the front and back surfaces, respectively.

On the first surface A1 of the substrate A, a plurality of detection electrodes B1 that extend in an X direction and are arranged in a Y direction, a plurality of lead wires C1 that are led from the plurality of detection electrodes B1, and a plurality of external connection terminals 1 that are connected to the plurality of lead wires C1 are formed. In addition, on the second substrate A2 of the substrate A, a plurality of detection electrodes B2 that extend in the Y direction and are arranged in the X direction, a plurality of lead wires C2 that are led from the plurality of detection electrodes B2, and a plurality of external connection terminals 2 that are connected to the plurality of lead wires C2 are formed. A direction orthogonal to both of the X direction and the Y direction is called a Z direction.

In a case where a finger of a user of the touch panel or a so-called stylus pen or the like contacts or approaches a portion where the detection electrode B1 formed on the first surface A1 of the substrate A and the detection electrode B2 formed on the second substrate A2 of the substrate A overlap each other, a capacitance changes at the portion such that the contact or the approach of the finger of the user or the like is detected. In this case, a detection signal representing that the contact or the approach of the finger of the user or the like is detected is transmitted from the plurality of detection electrodes B1 and B2 to the plurality of external connection terminals 1 and 2 through the plurality of lead wires C1 and C2.

The plurality of external connection terminals 1 and 2 are electrically connected to an external apparatus not shown. AS a result, the plurality of detection electrodes B1 and B2 are connected to the external apparatus such that the detection signal representing that the contact or the approach of the finger of the user or the like is detected is used in the external apparatus.

Hereinafter, the external connection terminal 1 according to the embodiment of the present invention will be described. Since the external connection terminal 2 has the same configuration as the external connection terminal 1, the description of the external connection terminal 2 will not be made.

Figure 2:
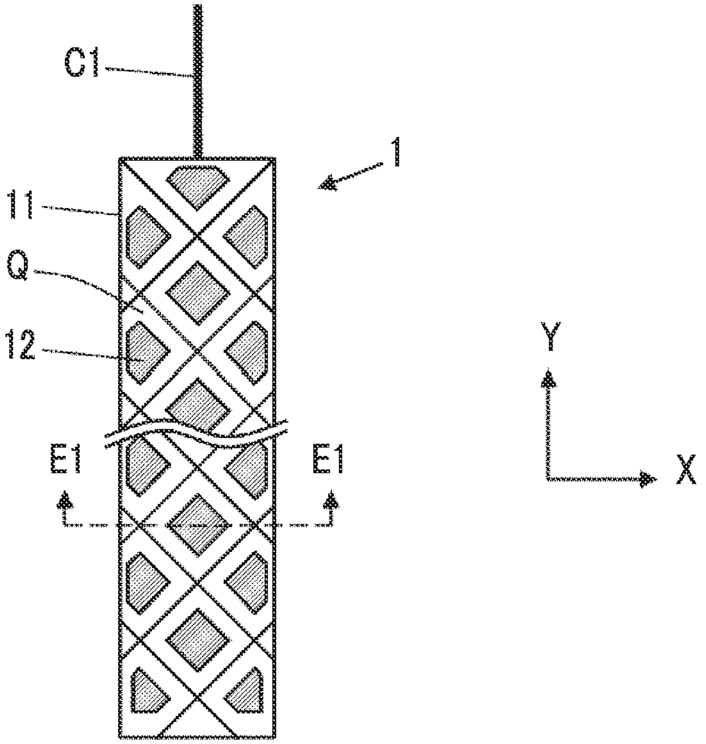
FIG. 2 is a plan view showing an external connection terminal according to the embodiment of the present invention.

FIG. 2 is a plan view showing the external connection terminal 1. The external connection terminal 1 is formed of a material including metal and includes a conduction portion 11 that is electrically connected to the lead wire C1 and a non-conduction portion 12 that is electrically insulated from the lead wire C1 and the conduction portion 11. The conduction portion 11 is formed by disposing a plurality of fine metal wires in a mesh-like pattern. The non-conduction portion 12 consists of a plurality of patterns surrounded by the conduction portion 11 by being disposed in each of opening portions Q of the meshes of the conduction portion 11.

In addition, a ratio x of an occupied area S2 of the non-conduction portion 12 to an occupied area S1 of the conduction portion 11 in a plan view, that is, the ratio x calculated by S2/S1 satisfies Inequality (1).

$$x \geq 0.30 \tag{1}$$

Here, the occupied area of the conduction portion 11 in the plan view refers to the sum of the areas of the plurality of fine metal wires forming the meshes of the conduction portion 11 projected to the XY plane in the area of the external connection terminal 1 projected to the XY plane. In addition, the occupied area of the non-conduction portion 12 in the plan view refers to the sum of the areas of the plurality of patterns of the non-conduction portion 12 projected to the XY plane in the area of the external connection terminal 1 projected to the XY plane.

In addition, a ratio y of a height H2 of the non-conduction portion 12 to a height H1 of the conduction portion 11, that is, the ratio y calculated by H2/H1 satisfies Inequality (2).

$$y \geq 1.00 \tag{2}$$

Figure 3:
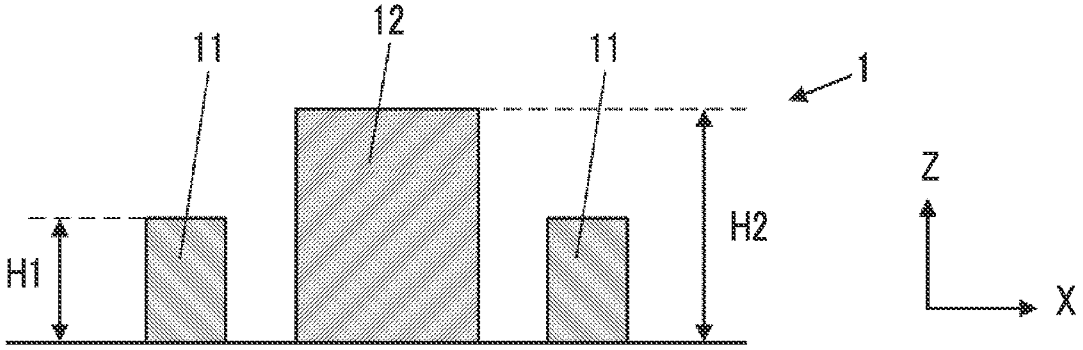
FIG. 3 is a cross-sectional view showing the external connection terminal according to the embodiment of the present invention.

Here, the heights of the conduction portion 11 and the non-conduction portion 12 refer to the dimensions of the conduction portion 11 and the non-conduction portion 12 in the Z direction. FIG. 3 is a cross-sectional view taken along line E1-E1 in FIG. 2 of the external connection terminal 1. In the example of FIG. 3, the ratio y of the height H2 of the non-conduction portion 12 to the height H1 of the conduction portion 11 satisfies $y>1.00$ and satisfies Inequality (2).

Further, the ratio x of the occupied area S2 of the non-conduction portion 12 to the occupied area S1 of the conduction portion 11 in the plan view and the ratio y of the height H2 of the non-conduction portion 12 to the height H1 of the conduction portion 11 satisfy Inequality (3).

$$y \geq -0.50 \times x + 1.25 \quad (3)$$

Incidentally, in a case where the substrates A overlapping each other are peeled off from each other in a state where the sheet-like substrate A is wound around a so-called roller or a plurality of sheet-like substrates A overlap each other, so-called peeling charging may occur. This peeling charging causes so-called spark failure in the external connection terminal 1.

In the external connection terminal 1 according to the embodiment of the present invention, as the values of the ratio x and the ratio y increase, a surface pressure applied from the substrates A overlapping each other to the external connection terminal 1 is dispersed in the non-conduction portion 12 such that a surface pressure applied to the conduction portion 11 decreases. The present inventors found that, in a case where the ratio x and the ratio y simultaneously satisfy Inequalities (1), (2), and (3), a surface pressure applied from the substrates A overlapping each other to the conduction portion 11 decreases and peeling charging is suppressed such that spark failure in the external connection terminal 1 is suppressed.

The external connection terminal 1 according to the embodiment simultaneously satisfies Inequalities (1), (2), and (3), and thus spark failure can be suppressed.

In addition, in a case where the ratio x and the ratio y simultaneously satisfy Inequalities (1), (2), and (3), the surface pressure applied from the substrates A overlapping each other to the external connection terminal 1 decreases. Therefore, even in a case where the sheet-like substrate A is wound around a roller or the plurality of sheet-like substrates A overlap each other such that the substrates A overlapping each other are rubbed with each other, the external connection terminal 1 is not likely to break by the rubbing of the substrates A.

In a case where the ratio x and the ratio y simultaneously satisfy Inequalities (1), (2), and (3), spark failure in the external connection terminal 1 is suppressed. In a case where the ratio x and the ratio y satisfy Inequality (2) and the following Inequalities (4) and (5), the surface pressure applied from the substrates A overlapping each other to the external connection terminal 1 further decreases, and spark failure in the external connection terminal 1 can be suppressed, which is more preferable.

$$x \geq 0.75 \quad (4)$$

$$y \geq -0.50 \times x + 1.675 \quad (5)$$

In addition, the shape of the external connection terminal 1 is not limited to a shape shown in FIG. 2. For example, an external connection terminal 1A shown in FIGS. 4 and 5 can also be formed. Here, FIG. 5 is a cross-sectional view taken along E2-E2 of the external connection terminal 1A. The external connection terminal 1A includes a conduction portion 11A that extends in the Y direction and has the same line width as the lead wire C1 and a non-conduction portion 12A that is disposed on both sides of the conduction portion 11A in the X direction and extends in the Y direction. The occupied area S1 of the conduction portion 11 and the occupied area S2 of the non-conduction portion 12 satisfy S1<S2. Therefore, the ratio x satisfies Inequality (1), and the ratio y of the height H2 of the non-conduction portion 12 to the height H1 of the conduction portion 11 satisfies $y>1.00$ and thus satisfies Inequality (2). Further, the ratio x and the ratio y satisfy Inequality (3).

Figure 6:
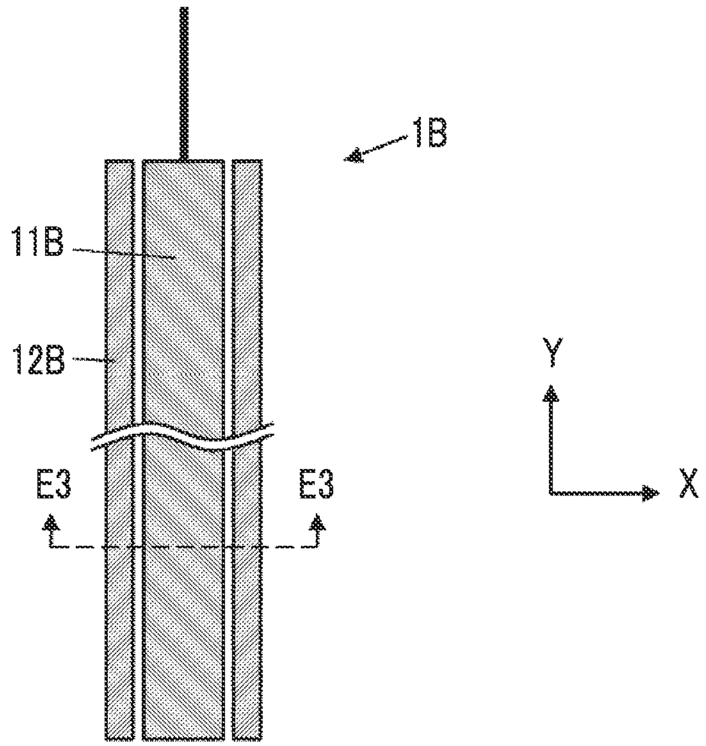
FIG. 6 is a plan view showing an external connection terminal according to a second modification example of the embodiment of the present invention.
Figure 7:
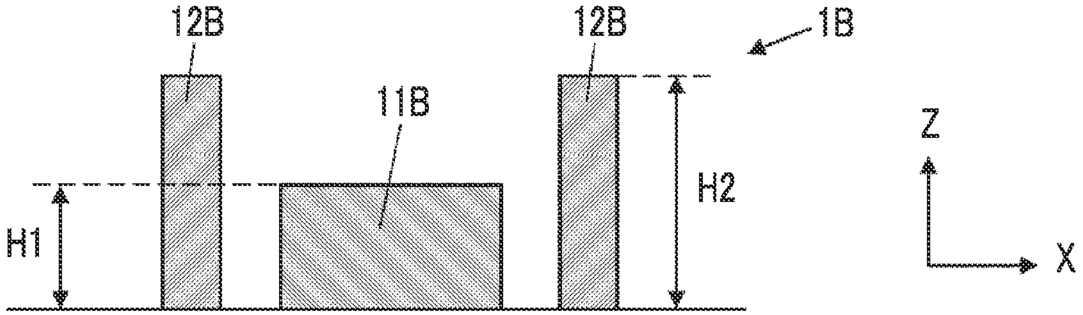
FIG. 7 is a cross-sectional view showing the external connection terminal according to the second modification example of the embodiment of the present invention.

In addition, an external connection terminal 1B shown in FIGS. 6 and 7 can also be formed. Here, FIG. 7 is a cross-sectional view taken along E3-E3 of the external connection terminal 1B. The external connection terminal 1B includes the conduction portion 11A that extends in the Y direction and the non-conduction portion 12A that is disposed on both sides of the conduction portion 11A in the X direction and extends in the Y direction. The occupied area S1 of the conduction portion 11 and the occupied area S2 of the non-conduction portion 12 satisfy S1>S2. Therefore, the ratio x satisfies Inequality (1), and the ratio y of the height H2 of the non-conduction portion 12 to the height H1 of the conduction portion 11 satisfies $y>1.00$ and thus satisfies Inequality (2). Further, the ratio x and the ratio y satisfy Inequality (3).

Figure 8:
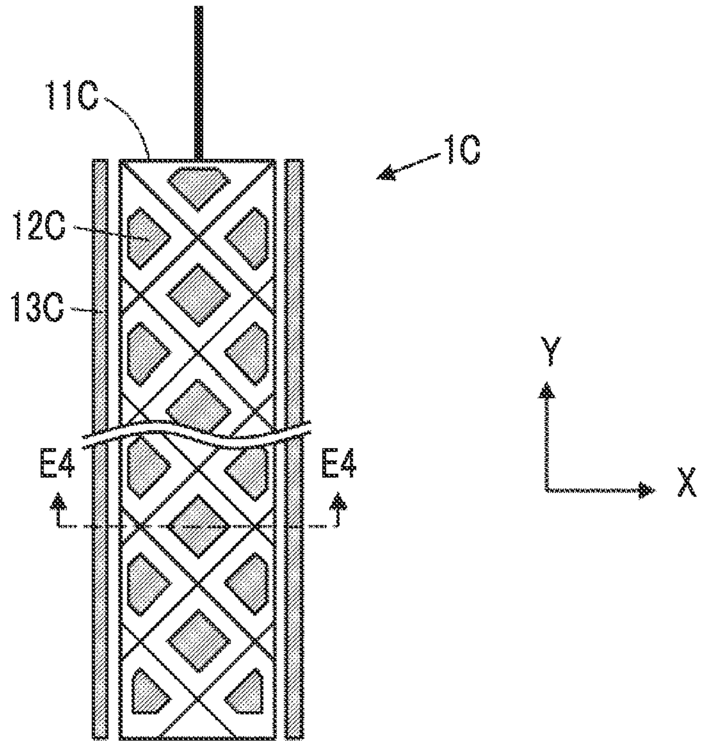
FIG. 8 is a plan view showing an external connection terminal according to a third modification example of the embodiment of the present invention.
Figure 9:
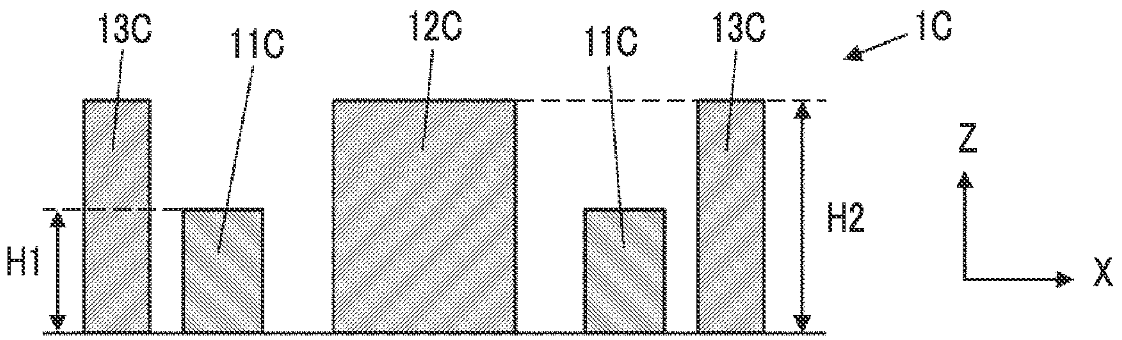
FIG. 9 is a cross-sectional view showing the external connection terminal according to the third modification example of the embodiment of the present invention.

In addition, an external connection terminal 1C shown in FIGS. 8 and 9 can also be formed. Here, FIG. 9 is a cross-sectional view taken along E4-E4 of the external connection terminal 1C. The external connection terminal 1C includes a mesh-like conduction portion 11C that is the same as the conduction portion 11 of the external connection terminal 1 shown in FIG. 2, a non-conduction portion 12C that is disposed in the mesh as in the non-conduction portion 12 of the external connection terminal 1 shown in FIG. 2, and a non-conduction portion 13C that is disposed on both sides of the conduction portion 11C in the X direction and extends in the Y direction. The ratio x of the occupied area S2 of the non-conduction portion 12 to the occupied area S1 of the conduction portion 11 in the plan view satisfies Inequality (1), and the ratio y of the height H2 of the non-conduction portion 12 to the height HI of the conduction portion 11 satisfies $y>1.00$ and thus satisfies Inequality (2). Further, the ratio x and the ratio y satisfy Inequality (3).

Figure 10:
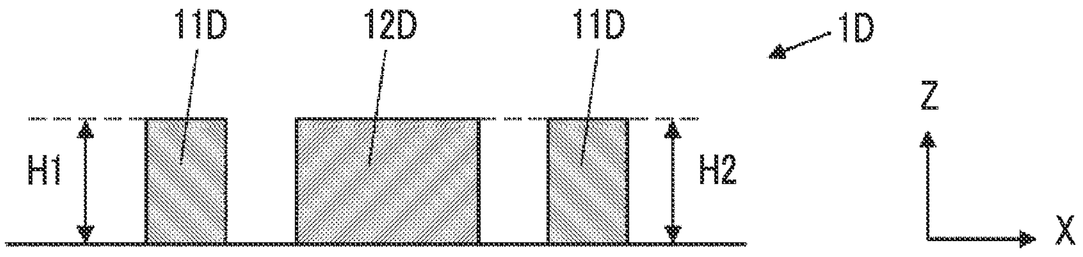
FIG. 10 is a cross-sectional view showing an external connection terminal according to a fourth modification example of the embodiment of the present invention.

In addition, the example where the ratio y of the height H2 of the non-conduction portion 12 to the height H1 of the conduction portion 11 satisfies $y>1.00$ is described. For example, even in a case where $y=1.00$ is satisfied as shown in FIG. 10, spark failure in the external connection terminal 1 can be suppressed as long as Inequalities (1), (2), and (3) are simultaneously satisfied. A shape of an external connection terminal 1D shown in FIG. 10 in a plan view is the same as the shape of the external connection terminal 1 shown in FIG. 2 in the plan view.

In addition, as an example of the electronic circuit electrically connected to the external connection terminal 1, the detection electrode B1 and the lead wire C1 shown in FIG. 1 are described. However, the electronic circuit electrically connected to the external connection terminal 1 is not limited to this example. The external connection terminal 1 can be connected to any electronic circuit electrically connected to an external apparatus.

Hereinafter, each of the members forming the external connection terminal 1 according to the embodiment will be described.

As a material for forming the external connection terminal 1, a metal or an alloy can be used. For example, the external connection terminal 1 can be formed of silver, copper, gold, aluminum, nickel, chromium, molybdenum, or tungsten. It is preferable that the external connection terminal 1 includes copper. However, the external connection terminal 1 may include a metal other than copper, for example, gold or silver. In addition, the external connection terminal 1 may include metallic silver, gelatin, or a polymer binder such as an acrylic styrene latex. Other preferable examples of the material include metals such as aluminum, silver, molybdenum, or titanium and an alloy thereof. In addition, a laminated structure of the materials may be used. For example, a fine metal wire having a laminated structure such as molybdenum/copper/molybdenum or molybdenum/aluminum/molybdenum can be used.

Further, for example, the external connection terminal 1B may include metal oxide particles, a metal paste such as a silver paste or a copper paste, or metal nanowire particles such as silver nanowire or copper nanowire.

Next, a method of forming the external connection terminal 1 will be described. As the method of forming the external connection terminal 1, for example, a sputtering method, a plating method, or a silver halide method can be appropriately used.

Next, a method of forming the external connection terminal 1 using a sputtering method will be described. First, by forming a copper foil layer by sputtering and forming a copper wire using the copper foil layer by photolithography, the external connection terminal 1 can be formed. The copper foil layer can also be formed by so-called vapor deposition instead of sputtering. As the copper foil layer, an electrolytic copper foil can be used in addition to a sputtered copper foil or a vapor deposition copper foil. More specifically, a step of forming copper wires described in JP2014-29614A can be used.

A method of forming the external connection terminal 1 using a plating method will be described. For example, the external connection terminal 1 can be formed using a metal plating film that is formed on an electroless plating underlayer by performing electroless plating on the underlayer. In this case, the external connection terminal 1 is formed by forming a catalyst ink including at least metal fine particles on a substrate in a patterned manner and dipping the substrate in an electroless plating bath to form a metal plating film. More specifically, a method of manufacturing a metal-coated substrate described in JP2014-159620A can be used.

In addition, the external connection terminal 1 is formed by forming a resin composition having at least a functional group capable of interacting a metal catalyst precursor on a substrate in a patterned manner, adding a catalyst or catalyst precursor, and dipping the substrate in an electroless plating bath to form a metal plating film. More specifically, a method of manufacturing a metal-coated substrate described in JP2012-144761A can be used.

A method of forming the external connection terminal 1 using a silver halide method will be described. First, in a state where an exposure pattern forming the external connection terminal 1 is formed and a glass mask where the exposure amount varies locally is disposed, a silver halide emulsion layer including silver halide is exposed and subsequently is developed such that the external connection terminal 1 can be formed. More specifically, a method of manufacturing the fine metal wire described in JP2012-6377A, JP2014-112512A, JP2014-209332A, JP2015-22397A, JP2016-192200A, or WO2016/157585A can be used.

Here, a method of manufacturing the glass mask where the exposure amount varies locally will be described. First, in a substrate for a glass mask where a chromium film is uniformly formed on one surface of blue plate glass, the chromium film is etched by photolithography to prepare a first pattern mask where the chromium film is patterned. Next, a photoresist film is formed on the surface of the first pattern mask where the chromium film is disposed, and the photoresist film is patterned by photolithography to prepare a second pattern mask. The patterned photoresist film includes an opening portion at a predetermined position where the chromium film is etched. Next, a chromium thin film having a predetermined film thickness is formed on the second pattern mask by sputtering using a chromium target. Next, by removing the photoresist film, a glass mask including a portion where the initial chromium film is formed on the glass, a portion where the glass is exposed, and a portion where the chromium thin film is formed on the glass by sputtering is obtained. The exposure amount in the portion where the chromium thin film is formed on the glass by sputtering is less than that in the portion where the glass is exposed. By adjusting the film thickness of the chromium thin film by sputtering, the exposure amount in the portion can be adjusted.

EXAMPLES

The present invention will be described in more detail based on the following examples. Materials, used amounts, ratios, treatment details, and treatment procedures shown in the following examples can be appropriately changed within a range not departing from the scope of the present invention. Accordingly, the scope of the present invention is not limited to the following examples.

Example 1

Preparation of Silver Halide Emulsion

The following solution 2 and the following solution 3 were simultaneously added for 20 minutes to the following solution 1 held at pH 4.5 and 38° C. in amounts corresponding to 90% of the entire amounts while stirring the solution 1. As a result, nuclear particles having a size of 0.16 μm were formed. Next, the following solution 4 and the following solution 5 were added to the obtained solution for 8 minutes, and the remaining 10% amounts of the solution 2 and the solution 3 were further added for 2 minutes. As a result, the nuclear particles grew to a size of 0.21 μm. Further, 0.15 g of potassium iodide was added to the obtained solution, and the particles were aged for 5 minutes. Then the formation of the particles was completed.

Solution 1
- Water: 750 ml
- Gelatin: 8.6 g
- Potassium bromide: 3 g
- 1,3-Dimethylimidazolidine-2-thione: 20 mg
- Sodium benzenethiolsulfonate: 10 mg
- Citric acid: 0.7 g Solution 2
- Water: 300 ml
- Silver nitrate: 150 g Solution 3
- Water: 300 ml
- Sodium chloride: 38 g
- Potassium bromide: 32 g
- Potassium hexachloroiridate (III)

(0.005% KCl 20% aqueous solution): 5 ml
Ammonium hexachlororhodate
(0.001% NaCl 20% aqueous solution): 7 ml Solution 4
Water: 100 ml
Silver nitrate: 50 g Solution 5
Water: 100 ml
Sodium chloride: 13 g
Potassium bromide: 11 g
Yellow prussiate of potash: 5 mg Next, the particles were cleaned with water by flocculation using an ordinary method. Specifically, the temperature of the obtained solution was decreased to 35° C., and the pH was decreased (to be in a range of pH 3.6±0.2) using sulfuric acid until silver halide precipitated. Next, about 3 L of the supernatant solution was removed from the obtained solution (first water cleaning). Next, 3 L of distilled water was added to the solution from which the supernatant solution was removed, and sulfuric acid was added until silver halide precipitated. About 3 L of the supernatant solution was removed again from the obtained solution (second water cleaning). By repeating the same operation as the second water cleaning once more (third water cleaning), the water cleaning and desalting step was completed. After the water cleaning and desalting, the emulsion was adjusted to pH 6.4 and pAg 7.5, 2.5 g of gelatin, 10 mg of sodium benzenethiolsulfonate, 3 mg of sodium benzenethiosulfinate, 15 mg of sodium thiosulfate, and 10 mg of chloroauric acid were added, and chemosensitization was performed at 55° C. to obtain the optimum sensitivity. Next, 100 mg of 1,3,3a,7-tetraazaindene as a stabilizer and 100 mg of PROXEL (trade name, manufactured by ICI Co., Ltd.) as a preservative were further added to the obtained emulsion. The finally obtained emulsion was a silver iodochlorobromide cubic particle emulsion having an average particle diameter (sphere equivalent diameter) of 0.22 μm and a coefficient of variation of 9%, in which the content of silver iodide was 0.08 mol %, and the ratio of silver chlorobromide was 70 mol % of silver chloride/30 mol % of silver bromide.

Preparation of Composition for Forming Photosensitive Layer 1,3,3a, 7-tetraazaindene ($1.2\times10^{-4}$ mol/mol Ag), hydroquinone (1.2x10−2 mol/mol Ag), citric acid ($3.0\times10^{-4}$ mol/mol Ag), 2,4-dichloro-6-hydroxy-1,3,5-triazine sodium salt (0.90 g/mol Ag), and a small amount of a hardening agent were added to the above-described emulsion to obtain a composition. Next, the pH of the composition was adjusted to 5.6 using citric acid.

A polymer latex including a polymer represented by Formula (P-1) shown below as an example and a dispersant formed of dialkylphenyl PEO sulfuric acid ester (a mass ratio dispersant/polymer was 2.0/100=0.02) was added to the above-described composition such that a mass ratio polymer/gelatin of the polymer to the gelatin in the composition was 0.5/1.

Further, EPOXY RESIN DY 022 (trade name, manufactured by Nagase ChemteX Corporation) as a crosslinking agent was added. The addition amount of the crosslinking agent was adjusted such that the amount of the crosslinking agent in the silver halide-containing photosensitive layer described below was 0.09 g/m$^2$.

This way, the composition for forming a photosensitive layer was prepared.

The polymer represented by Formula (P-1) shown below as an example was synthesized with reference to JP3305459B and JP3754745B.

(P-1)

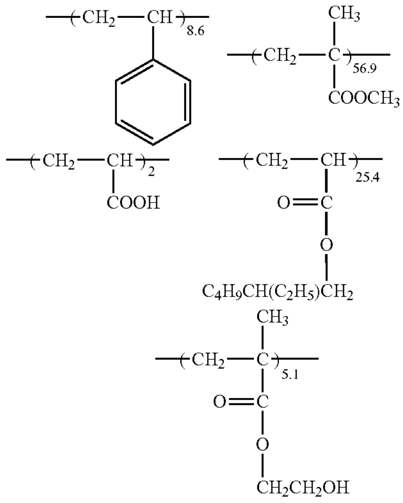

Photosensitive Layer Forming Step

A corona discharge treatment was performed on an insulating substrate, a gelatin layer having a thickness of 0.1 μm as a undercoat layer was provided on one surface of the substrate, and an antihalation layer including a dye having an optical density of about 1.0 and decolorized by an alkali developer was provided on the undercoat layer. The composition for forming a photosensitive layer was applied to the antihalation layer, and a gelatin layer having a thickness of 0.15 μm was further provided. As a result, a substrate having opposite surfaces on which the photosensitive layer was formed was obtained. In the formed photosensitive layer, the silver content was 6.0 g/m$^2$, and the gelatin content was 1.0 g/m$^2$.

Exposure Development Step

A glass mask corresponding to the patterns of the plurality of detection electrodes B1, the plurality of lead wires C1, and the plurality of external connection terminals 1 shown in FIGS. 1 and 2 was disposed on one surface of the substrate where the photosensitive layer was formed. In this state, the substrate was exposed using parallel light from a high pressure mercury lamp as a light source. After the exposure, the surfaces of the film A were developed using the following developer and were developed using a fixing solution (trade name; N3X-R for CN16X, manufactured by Fujifilm Corporation). Further, the film A was rinsed with pure water and was dried. As a result, a substrate having opposite surfaces on which the conductive member formed of Ag wire and the gelatin layer were formed was obtained. The gelatin layer was formed between the Ag wires.

Composition of Developer

1 L of the developer included the following compounds.
Hydroquinone: 0.037 mol/L
N-methylamino phenol: 0.016 mol/L
Sodium metaborate: 0.140 mol/L Sodium hydroxide: 0.360 mol/L
Sodium bromide: 0.031 mol/L
Potassium metabisulfite: 0.187 mol/L Gelatin Decomposition Treatment The substrate having opposite surfaces on which the conductive member formed of Ag wire and the gelatin layer were formed was dipped in an aqueous solution (concentration of protease: 0.5 mass %; liquid temperature: 40° C.) of protease (BIOPRASE AL-15FG, manufactured by Nagase ChemteX Corporation) for 120 seconds. The substrate was taken out from the aqueous solution, was dipped in warm water (liquid temperature:)50° C. for 120 seconds, and was cleaned.

Resistance Reducing Treatment

The substrate having undergone the gelatin decomposition treatment was calendared at a pressure of 30 kN using a calendering device including a metal roller. After the calendering treatment, the substrate was heated by being caused to pass through a superheated steam bath at a temperature of 150° C. for 120 seconds. An external connection terminal having a shape shown in FIG. 2 was formed on one surface of the substrate obtained as described above. In the external connection terminal, the ratio x of the occupied area S2 of the non-conduction portion 12 to the occupied area S1 of the conduction portion 11 was 0.50. In addition, the external connection terminal has a cross-sectional shape shown in FIG. 10, the height H1 of the conduction portion 11 was 1.25 μm, and the height H2 of the non-conduction portion 12 was 1.25 μm. Therefore, the ratio of the height H2 of the non-conduction portion 12 to the height H1 of the conduction portion 11 was 1.00.

Example 2

An external connection terminal according to Example 2 was prepared using the same method as that of Example 1, except that a glass mask where the occupied area S2 of the non-conduction portion 12 was widened was used. In the external connection terminal, the ratio x of the occupied area S2 of the non-conduction portion 12 to the occupied area S1 of the conduction portion 11 was 0.75. In addition, the ratio of the height H2 of the non-conduction portion 12 to the height H1 of the conduction portion 11 was 1.00.

Example 3

An external connection terminal according to Example 3 was prepared using the same method as that of Example 2, except that a glass mask where the occupied area S2 of the non-conduction portion 12 was more than that of Example 2 was used. In the external connection terminal, the ratio x of the occupied area S2 of the non-conduction portion 12 to the occupied area S1 of the conduction portion 11 was 1.00. In addition, the ratio of the height H2 of the non-conduction portion 12 to the height H1 of the conduction portion 11 was 1.00.

Example 4

An external connection terminal according to Example 4 was prepared using the same method as that of Example 3, except that a glass mask where the occupied area S2 of the non-conduction portion 12 was more than that of Example 3 was used. In the external connection terminal, the ratio x of the occupied area S2 of the non-conduction portion 12 to the occupied area S1 of the conduction portion 11 was 1.25. In addition, the ratio of the height H2 of the non-conduction portion 12 to the height H1 of the conduction portion 11 was 1.00.

Example 5

An external connection terminal according to Example 5 was prepared using the same method as that of Example 4, except that a glass mask where the occupied area S2 of the non-conduction portion 12 was more than that of Example 4 was used. In the external connection terminal, the ratio x of the occupied area S2 of the non-conduction portion 12 to the occupied area S1 of the conduction portion 11 was 1.50. In addition, the ratio of the height H2 of the non-conduction portion 12 to the height H1 of the conduction portion 11 was 1.00.

Example 6

Preparation of Glass Mask

First, in a substrate for a glass mask where a chromium film was uniformly formed on one surface of blue plate glass, the chromium film was etched by photolithography to prepare a first pattern mask where the chromium film was patterned such that the patterns corresponding to the plurality of detection electrodes B1, the plurality of lead wires C1, and the plurality of external connection terminals shown in FIGS. 1 and 2 were formed. A photoresist film was formed on the surface of the first pattern mask where the chromium film is disposed, and the photoresist film was patterned by photolithography to prepare a second pattern mask. The patterned photoresist film had an opening portion in the portion where the chromium film was removed, that is, in the portion corresponding to the non-conduction portion 12 of the external connection terminal. Next, a chromium thin film having a predetermined film thickness was formed on the second pattern mask by sputtering using a chromium target. Finally, by removing the photoresist film, a glass mask including a portion where the initial chromium film was formed on the glass, a portion where the glass is exposed, and a portion where the chromium thin film was formed on the glass by sputtering was obtained.

An external connection terminal according to Example 6 was prepared using the same method as that of Example 1, except that the exposure development step was performed using this glass mask. In the external connection terminal, the ratio x of the occupied area S2 of the non-conduction portion 12 to the occupied area S1 of the conduction portion 11 was 0.40. In addition, the height H1 of the conduction portion 11 was 1.25 μm, the height H2 of the non-conduction portion 12 was 1.31 μm, and the ratio y of the height H2 to the height H1 was 1.05.

Example 7

An external connection terminal according to Example 7 was prepared using the same method as that of Example 6, except that a glass mask where the occupied area S2 of the non-conduction portion 12 was more than that of Example 6 was used. In the external connection terminal, the ratio x of the occupied area S2 of the non-conduction portion 12 to the occupied area S1 of the conduction portion 11 was 0.48.

In addition, the ratio y of the height H2 of the non-conduction portion 12 to the height H1 of the conduction portion 11 was 1.05.

Example 8

An external connection terminal according to Example 8 was prepared using the same method as that of Example 7, except that a glass mask where the occupied area S2 of the non-conduction portion 12 was more than that of Example 7 was used. In the external connection terminal, the ratio x of the occupied area S2 of the non-conduction portion 12 to the occupied area S1 of the conduction portion 11 was 1.00. In addition, the ratio y of the height H2 of the non-conduction portion 12 to the height Hl of the conduction portion 11 was 1.05.

Example 9

An external connection terminal according to Example 9 was prepared using the same method as that of Example 8, except that a glass mask where the occupied area S2 of the non-conduction portion 12 was more than that of Example 8 was used. In the external connection terminal, the ratio x of the occupied area S2 of the non-conduction portion 12 to the occupied area S1 of the conduction portion 11 was 1.25. In addition, the ratio y of the height H2 of the non-conduction portion 12 to the height H1 of the conduction portion 11 was 1.05.

Example 10

An external connection terminal according to Example 10 was prepared using the same method as that of Example 6, except that the exposure amount of the substrate in the exposure development step was increased using the glass mask where the chromium thin film formed by sputtering was thicker than that of Example 6. In the external connection terminal, the ratio x of the occupied area S2 of the non-conduction portion 12 to the occupied area S1 of the conduction portion 11 was 0.40. In addition, the height H1 of the conduction portion 11 was 1.25 μm, the height H2 of the non-conduction portion 12 was 1.36 μm, and the ratio y of the height H2 to the height H1 was 1.09.

Example 11

An external connection terminal according to Example 11 was prepared using the same method as that of Example 10, except that a glass mask where the occupied area S2 of the non-conduction portion 12 was more than that of Example 10 was used. In the external connection terminal, the ratio x of the occupied area S2 of the non-conduction portion 12 to the occupied area S1 of the conduction portion 11 was 1.00. In addition, the ratio y of the height H2 of the non-conduction portion 12 to the height H1 of the conduction portion 11 was 1.09.

Example 12

An external connection terminal according to Example 12 was prepared using the same method as that of Example 11, except that a glass mask where the occupied area S2 of the non-conduction portion 12 was more than that of Example 11 was used. In the external connection terminal, the ratio x of the occupied area S2 of the non-conduction portion 12 to the occupied area S1 of the conduction portion 11 was 1.25. In addition, the ratio y of the height H2 of the non-conduction portion 12 to the height H1 of the conduction portion 11 was 1.09.

Example 13

An external connection terminal according to Example 13 was prepared using the same method as that of Example 10, except that the exposure amount of the substrate in the exposure development step was increased using the glass mask where the occupied area S2 of the non-conduction portion 12 was less than that of Example 10 and the chromium thin film formed by sputtering was thicker than that of Example 10. In the external connection terminal, the ratio x of the occupied area S2 of the non-conduction portion 12 to the occupied area S1 of the conduction portion 11 was 0.30. In addition, the height H1 of the conduction portion 11 was 1.25 μm, the height H2 of the non-conduction portion 12 was 1.38 μm, and the ratio y of the height H2 to the height H1 was 1.10.

Example 14

An external connection terminal according to Example 14 was prepared using the same method as that of Example 13, except that a glass mask where the occupied area S2 of the non-conduction portion 12 was more than that of Example 13 was used. In the external connection terminal, the ratio x of the occupied area S2 of the non-conduction portion 12 to the occupied area S1 of the conduction portion 11 was 0.75. In addition, the ratio y of the height H2 of the non-conduction portion 12 to the height H1 of the conduction portion 11 was 1.10.

Example 15

An external connection terminal according to Example 15 was prepared using the same method as that of Example 14, except that a glass mask where the occupied area S2 of the non-conduction portion 12 was more than that of Example 14 was used. In the external connection terminal, the ratio x of the occupied area S2 of the non-conduction portion 12 to the occupied area S1 of the conduction portion 11 was 1.00. In addition, the ratio y of the height H2 of the non-conduction portion 12 to the height H1 of the conduction portion 11 was 1.10.

Example 16

An external connection terminal according to Example 16 was prepared using the same method as that of Example 15, except that a glass mask where the occupied area S2 of the non-conduction portion 12 was more than that of Example 15 was used. In the external connection terminal, the ratio x of the occupied area S2 of the non-conduction portion 12 to the occupied area S1 of the conduction portion 11 was 1.25. In addition, the ratio y of the height H2 of the non-conduction portion 12 to the height H1 of the conduction portion 11 was 1.10.

Example 17

An external connection terminal according to Example 17 was prepared using the same method as that of Example 13, except that the exposure amount of the substrate in the exposure development step was increased using the glass mask where the occupied area S2 of the non-conduction portion 12 was more than that of Example 13 and the chromium thin film formed by sputtering was thicker than that of Example 13. In the external connection terminal, the ratio x of the occupied area S2 of the non-conduction portion 12 to the occupied area S1 of the conduction portion 11 was 0.50. In addition, the height H1 of the conduction portion 11 was 1.25 μm, the height H2 of the non-conduction portion 12 was 1.63 μm, and the ratio y of the height H2 to the height H1 was 1.30.

Example 18

An external connection terminal according to Example 18 was prepared using the same method as that of Example 17, except that a glass mask where the occupied area S2 of the non-conduction portion 12 was more than that of Example 17 was used. In the external connection terminal, the ratio x of the occupied area S2 of the non-conduction portion 12 to the occupied area S1 of the conduction portion 11 was 0.75. In addition, the ratio y of the height H2 of the non-conduction portion 12 to the height H1 of the conduction portion 11 was 1.30.

Example 19

An external connection terminal according to Example 19 was prepared using the same method as that of Example 18, except that a glass mask where the occupied area S2 of the non-conduction portion 12 was more than that of Example 18 was used. In the external connection terminal, the ratio x of the occupied area S2 of the non-conduction portion 12 to the occupied area S1 of the conduction portion 11 was 1.00. In addition, the ratio y of the height H2 of the non-conduction portion 12 to the height H1 of the conduction portion 11 was 1.30.

Example 20

An external connection terminal according to Example 20 was prepared using the same method as that of Example 17, except that the exposure amount of the substrate in the exposure development step was increased using the glass mask where the occupied area S2 of the non-conduction portion 12 was less than that of Example 17 and the chromium thin film formed by sputtering was thicker than that of Example 17. In the external connection terminal, the ratio x of the occupied area S2 of the non-conduction portion 12 to the occupied area S1 of the conduction portion 11 was 0.30. In addition, the height H1 of the conduction portion 11 was 1.25 μm, the height H2 of the non-conduction portion 12 was 2.00 μm, and the ratio y of the height H2 to the height H1 was 1.60.

Example 21

An external connection terminal according to Example 21 was prepared using the same method as that of Example 20, except that a glass mask where the occupied area S2 of the non-conduction portion 12 was more than that of Example 20 was used. In the external connection terminal, the ratio x of the occupied area S2 of the non-conduction portion 12 to the occupied area S1 of the conduction portion 11 was 0.50. In addition, the ratio y of the height H2 of the non-conduction portion 12 to the height H1 of the conduction portion 11 was 1.60.

Example 22

An external connection terminal according to Example 22 was prepared using the same method as that of Example 21, except that a glass mask where the occupied area S2 of the non-conduction portion 12 was more than that of Example 21 was used. In the external connection terminal, the ratio x of the occupied area S2 of the non-conduction portion 12 to the occupied area S1 of the conduction portion 11 was 1.00. In addition, the ratio y of the height H2 of the non-conduction portion 12 to the height H1 of the conduction portion 11 was 1.60.

Example 23

An external connection terminal according to Example 23 was prepared using the same method as that of Example 22, except that a glass mask where the occupied area S2 of the non-conduction portion 12 was more than that of Example 22 was used. In the external connection terminal, the ratio x of the occupied area S2 of the non-conduction portion 12 to the occupied area S1 of the conduction portion 11 was 1.50. In addition, the ratio y of the height H2 of the non-conduction portion 12 to the height H1 of the conduction portion 11 was 1.60.

Example 24

An external connection terminal according to Example 24 was prepared using the same method as that of Example 20, except that the exposure amount of the substrate in the exposure development step was increased using the glass mask where the chromium thin film formed by sputtering was thicker than that of Example 20. In the external connection terminal, the ratio x of the occupied area S2 of the non-conduction portion 12 to the occupied area S1 of the conduction portion 11 was 0.30. In addition, the height H1 of the conduction portion 11 was 1.25 μm, the height H2 of the non-conduction portion 12 was 2.50 μm, and the ratio y of the height H2 to the height H1 was 2.00.

Example 25

An external connection terminal according to Example 25 was prepared using the same method as that of Example 24, except that a glass mask where the occupied area S2 of the non-conduction portion 12 was more than that of Example 24 was used. In the external connection terminal, the ratio x of the occupied area S2 of the non-conduction portion 12 to the occupied area S1 of the conduction portion 11 was 0.50. In addition, the ratio y of the height H2 of the non-conduction portion 12 to the height H1 of the conduction portion 11 was 2.00.

Example 26

An external connection terminal according to Example 26 was prepared using the same method as that of Example 25, except that a glass mask where the occupied area S2 of the non-conduction portion 12 was more than that of Example 25 was used. In the external connection terminal, the ratio x of the occupied area S2 of the non-conduction portion 12 to the occupied area S1 of the conduction portion 11 was 0.75. In addition, the ratio y of the height H2 of the non-conduction portion 12 to the height H1 of the conduction portion 11 was 2.00.

Example 27

An external connection terminal according to Example 27 was prepared using the same method as that of Example 26, except that a glass mask where the occupied area S2 of the non-conduction portion 12 was more than that of Example 26 was used. In the external connection terminal, the ratio x of the occupied area S2 of the non-conduction portion 12 to the occupied area S1 of the conduction portion 11 was 1.50. In addition, the ratio y of the height H2 of the non-conduction portion 12 to the height H1 of the conduction portion 11 was 2.00.

Example 28

Figure 4:
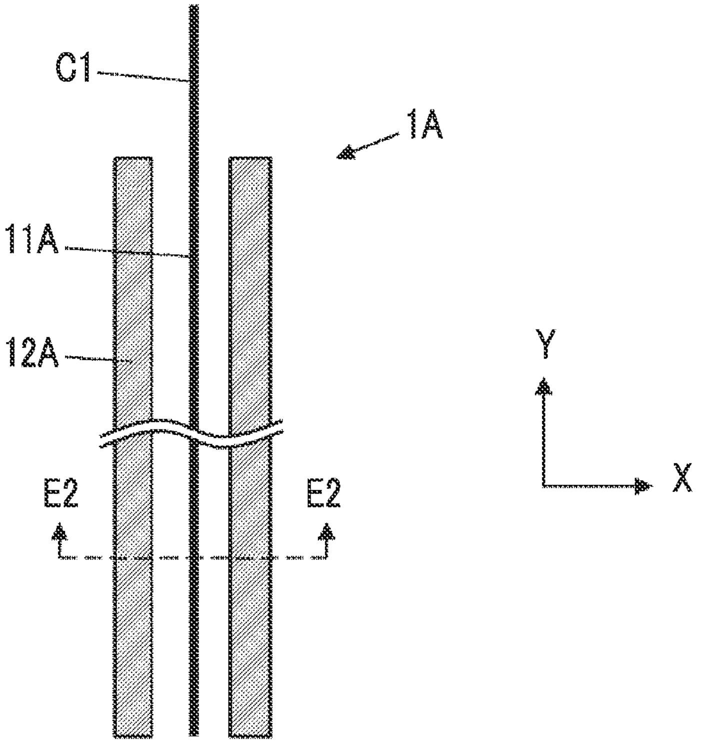
FIG. 4 is a plan view showing an external connection terminal according to a first modification example of the embodiment of the present invention.
Figure 5:
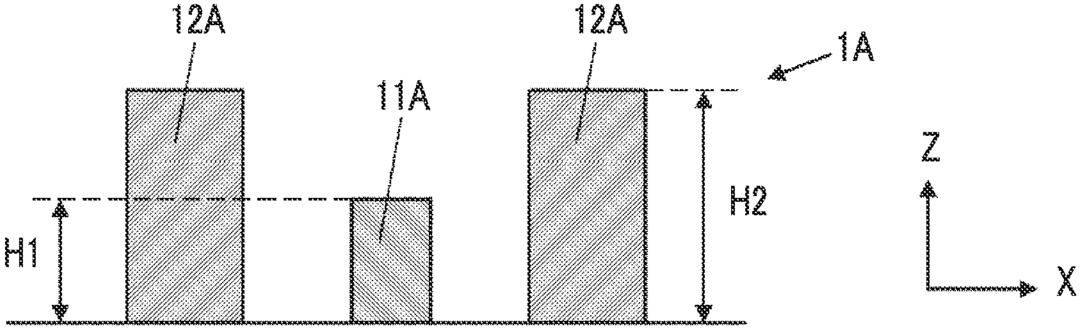
FIG. 5 is a cross-sectional view showing the external connection terminal according to the first modification example of the embodiment of the present invention.

An external connection terminal according to Example 28 was prepared using the same method as that of Example 6, except that, in the step of preparing the glass mask according to Example 6, a glass mask having the pattern corresponding to the shape of the external connection terminal 1A of FIG. 4 was prepared instead of the glass mask having the pattern corresponding to the shape of the external connection terminal 1 of FIG. 2, and the exposure amount of the substrate in the exposure development step was increased. In the external connection terminal, the ratio x of the occupied area S2 of the non-conduction portion 12 to the occupied area S1 of the conduction portion 11 was 1.60. In addition, the height H1 of the conduction portion 11 was 1.25 μm, the height H2 of the non-conduction portion 12 was 2.00 μm, and the ratio y of the height H2 to the height H1 was 1.60.

Example 29

An external connection terminal according to Example 29 was prepared using the same method as that of Example 6, except that, in the step of preparing the glass mask according to Example 6, a glass mask having the pattern corresponding to the shape of the external connection terminal 1B of FIG. 6 was prepared instead of the glass mask having the pattern corresponding to the shape of the external connection terminal 1 of FIG. 2, and the exposure amount of the substrate in the exposure development step was increased. In the external connection terminal, the ratio x of the occupied area S2 of the non-conduction portion 12 to the occupied area S1 of the conduction portion 11 was 0.75. In addition, the height H1 of the conduction portion 11 was 1.25 μm, the height H2 of the non-conduction portion 12 was 2.00 μm, and the ratio y of the height H2 to the height H1 was 1.60.

Example 30

An external connection terminal according to Example 30 was prepared using the same method as that of Example 6, except that, in the step of preparing the glass mask according to Example 6, a glass mask having the pattern corresponding to the shape of the external connection terminal 1C of FIG. 8 was prepared instead of the glass mask having the pattern corresponding to the shape of the external connection terminal 1 of FIG. 2, and the exposure amount of the substrate in the exposure development step was increased. In the external connection terminal, the ratio x of the occupied area S2 of the non-conduction portion 12 to the occupied area S1 of the conduction portion 11 was 1.50. In addition, the height H1 of the conduction portion 11 was 1.25 μm, the height H2 of the non-conduction portion 12 was 2.00 μm, and the ratio y of the height H2 to the height H1 was 1.60.

Comparative Example 1

Figure 11:
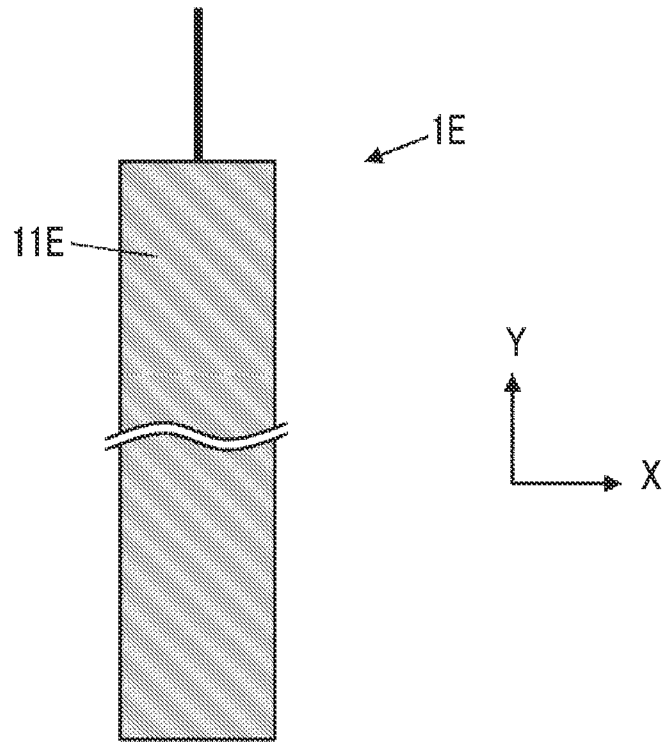
FIG. 11 is a plan view showing an external connection terminal according to Comparative Example 1.

An external connection terminal according to Comparative Example 1 was prepared using the same method as that of Example 1, except that a glass mask corresponding to a shape of an external connection terminal 1E of FIG. 11 was used in the exposure development step. The external connection terminal 1E of FIG. 11 is formed of a plate-shaped conduction portion 11E that extends in the Y direction without including the non-conduction portion. The height H1 of the conduction portion 11E was 2.00 μm.

Comparative Example 2

Figure 12:
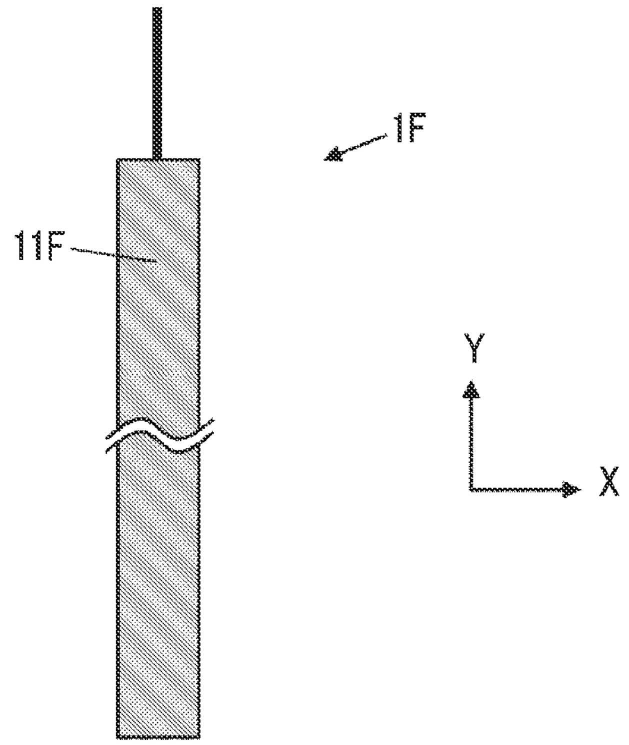
FIG. 12 is a plan view showing an external connection terminal according to Comparative Example 2.

An external connection terminal according to Comparative Example 2 was prepared using the same method as that of Example 1, except that a glass mask corresponding to a shape of an external connection terminal 1F of FIG. 12 was used in the exposure development step. The external connection terminal 1F of FIG. 12 is formed of a plate-shaped conduction portion 11F that extends in the Y direction and has a narrower width in the X direction than the conduction portion 11E of FIG. 12 without including the non-conduction portion. The height H1 of the conduction portion 11F was 2.00 μm.

Comparative Example 3

Figure 13:
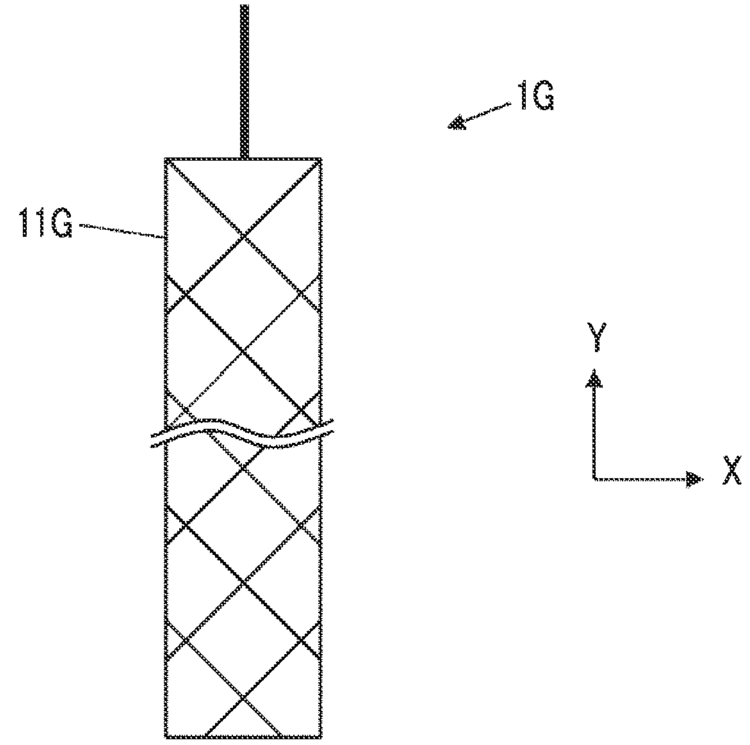
FIG. 13 is a plan view showing an external connection terminal according to Comparative Example 3.

An external connection terminal according to Comparative Example 3 was prepared using the same method as that of Example 1, except that a glass mask corresponding to a shape of an external connection terminal 1G of FIG. 13 was used in the exposure development step.

The external connection terminal 1G of FIG. 13 is formed of a conduction portion 11G having the same shape as the conduction portion 11 according to Example 1 shown in FIG. 2 without including the non-conduction portion. The height H1 of the conduction portion 11G was 1.25 μm.

Comparative Example 4

A first glass mask having a pattern corresponding to the shape of the conduction portion 11 according to Example 1 and a second glass mask having a pattern corresponding to the shape of the non-conduction portion 12 were prepared. After forming the conduction portion 11 on the substrate with the same method as that of Example 1 using the first glass mask, the non-conduction portion 12 that was formed of a resin material obtained by curing the following curable composition with ultraviolet light (UV) irradiation was formed on the substrate by photolithography using the second glass mask. In the external connection terminal, the ratio x of the occupied area S2 of the non-conduction portion 12 to the occupied area S1 of the conduction portion 11 was 0.92. In addition, the height H1 of the conduction portion 11 was 1.25 μm, the height H2 of the non-conduction portion 12 was 2.00 μm, and the ratio y of the height H2 to the height H1 was 1.60.

Curable Composition:

M-315 (manufactured by Toagosei Co., Ltd.: isocyanuric acid EO-modified triacrylate (trifunctional acrylate compound having an isocyanuric ring structure)

40.0 parts by weight

FA-513AS (manufactured by Hitachi Chemical Co., Ltd.; FANCRYL FA-513AS, dicyclopentanyl acrylate, Tg of homopolymer=120° C.)

30.0 parts by weight

NVP (manufactured by FUJIFILM Wako Pure Chemical Corporation; N-vinylpyrrolidone)

29.5 parts by weight

IRGACURE 184 (Irg. 184) (manufactured by BASF SE; 1-hydroxycyclohexyl phenyl ketone)

0.5 parts by weight

Comparative Example 5

Figure 14:
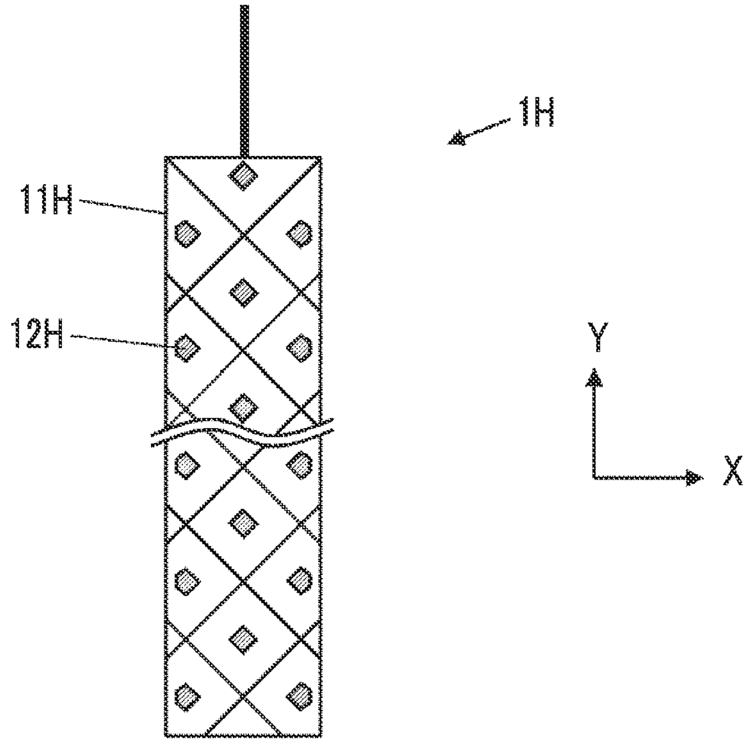
FIG. 14 is a plan view showing an external connection terminal according to Comparative Example 4.

An external connection terminal according to Comparative Example 5 was prepared using the same method as that of Example 6, except that, in the step of preparing the glass mask according to Example 6, a glass mask having a pattern corresponding to a shape of an external connection terminal 1H of FIG. 14 was prepared instead of the glass mask having the pattern corresponding to the shape of the external connection terminal 1 of FIG. 2. The external connection terminal 1H of FIG. 14 corresponds to that where the size of the non-conduction portion 12 was less than that in FIG. 2. In the external connection terminal, the ratio x of the occupied area S2 of the non-conduction portion 12 to the occupied area S1 of the conduction portion 11 was 0.30. In addition, both of the height H1 of the conduction portion 11 and the height H2 of the non-conduction portion 12 were 1.25 μm, and the ratio y of the height H2 to the height H1 was 1.00.

Comparative Example 6

An external connection terminal according to Comparative Example 6 was prepared using the same method as that of Comparative Example 5, except that a glass mask where the occupied area S2 of the non-conduction portion 12 was more than that of Comparative Example 5 was used. In the external connection terminal, the ratio x of the occupied area S2 of the non-conduction portion 12 to the occupied area S1 of the conduction portion 11 was 0.48. In addition, the ratio y of the height H2 of the non-conduction portion 12 to the height H1 of the conduction portion 11 was 1.00.

Comparative Example 7

An external connection terminal according to Comparative Example 7 was prepared using the same method as that of Example 6, except that, in the step of preparing the glass mask according to Example 6, a glass mask having a pattern corresponding to a shape of an external connection terminal 1H of FIG. 14 was prepared instead of the glass mask having the pattern corresponding to the shape of the external connection terminal 1 of FIG. 2. In the external connection terminal, the ratio x of the occupied area S2 of the non-conduction portion 12 to the occupied area S1 of the conduction portion 11 was 0.20. In addition, the height H1 of the conduction portion 11 was 1.25 μm, the height H2 of the non-conduction portion 12 was 1.31 μm, and the ratio y of the height H2 to the height H1 was 1.05.

Comparative Example 8

An external connection terminal according to Comparative Example 8 was prepared using the same method as that of Comparative Example 7, except that a glass mask where the occupied area S2 of the non-conduction portion 12 was more than that of Comparative Example 7 was used. In the external connection terminal, the ratio x of the occupied area S2 of the non-conduction portion 12 to the occupied area S1 of the conduction portion 11 was 0.30. In addition, the ratio y of the height H2 of the non-conduction portion 12 to the height H1 of the conduction portion 11 was 1.05.

Comparative Example 9

An external connection terminal according to Comparative Example 9 was prepared using the same method as that of Comparative Example 7, except that the exposure amount of the substrate in the exposure development step was increased using the glass mask where the chromium thin film formed by sputtering was thicker than that of Comparative Example 7. In the external connection terminal, the ratio x of the occupied area S2 of the non-conduction portion 12 to the occupied area S1 of the conduction portion 11 was 0.20. In addition, the height H1 of the conduction portion 11 was 1.25 μm, the height H2 of the non-conduction portion 12 was 1.36 μm, and the ratio y of the height H2 to the height H1 was 1.09.

Comparative Example 10

An external connection terminal according to Comparative Example 10 was prepared using the same method as that of Comparative Example 9, except that a glass mask where the occupied area S2 of the non-conduction portion 12 was more than that of Comparative Example 9 was used. In the external connection terminal, the ratio x of the occupied area S2 of the non-conduction portion 12 to the occupied area S1 of the conduction portion 11 was 0.28. In addition, the ratio y of the height H2 of the non-conduction portion 12 to the height H1 of the conduction portion 11 was 1.09.

Comparative Example 11

An external connection terminal according to Comparative Example 11 was prepared using the same method as that of Comparative Example 9, except that the exposure amount of the substrate in the exposure development step was increased using the glass mask where the chromium thin film formed by sputtering was thicker than that of Comparative Example 9. In the external connection terminal, the ratio x of the occupied area S2 of the non-conduction portion 12 to the occupied area S1 of the conduction portion 11 was 0.20. In addition, the height H1 of the conduction portion 11 was 1.25 μm, the height H2 of the non-conduction portion 12 was 1.38 μm, and the ratio y of the height H2 to the height H1 was 1.10.

Comparative Example 12

An external connection terminal according to Comparative Example 12 was prepared using the same method as that of Comparative Example 11, except that a glass mask where the occupied area S2 of the non-conduction portion 12 was more than that of Comparative Example 11 was used. In the external connection terminal, the ratio x of the occupied area S2 of the non-conduction portion 12 to the occupied area S1 of the conduction portion 11 was 0.28. In addition, the ratio y of the height H2 of the non-conduction portion 12 to the height H1 of the conduction portion 11 was 1.10.

Comparative Example 13

An external connection terminal according to Comparative Example 13 was prepared using the same method as that of Comparative Example 11, except that the exposure amount of the substrate in the exposure development step was increased using the glass mask where the chromium thin film formed by sputtering was thicker than that of Comparative Example 11. In the external connection terminal, the ratio x of the occupied area S2 of the non-conduction portion 12 to the occupied area S1 of the conduction portion 11 was 0.20. In addition, the height H1 of the conduction portion 11 was 1.25 μm, the height H2 of the non-conduction portion 12 was 2.00 μm, and the ratio y of the height H2 to the height H1 was 1.60.

Comparative Example 14

An external connection terminal according to Comparative Example 14 was prepared using the same method as that of Comparative Example 13, except that a glass mask where the occupied area S2 of the non-conduction portion 12 was more than that of Comparative Example 13 was used. In the external connection terminal, the ratio x of the occupied area S2 of the non-conduction portion 12 to the occupied area S1 of the conduction portion 11 was 0.28. In addition, the ratio y of the height H2 of the non-conduction portion 12 to the height H1 of the conduction portion 11 was 1.60.

Comparative Example 15

An external connection terminal according to Comparative Example 15 was prepared using the same method as that of Comparative Example 13, except that the exposure amount of the substrate in the exposure development step was increased using the glass mask where the chromium thin film formed by sputtering was thicker than that of Comparative Example 13. In the external connection terminal, the ratio x of the occupied area S2 of the non-conduction portion 12 to the occupied area S1 of the conduction portion 11 was 0.20. In addition, the height H1 of the conduction portion 11 was 1.25 μm, the height H2 of the non-conduction portion 12 was 2.50 μm, and the ratio y of the height H2 to the height H1 was 2.00.

Comparative Example 16

An external connection terminal according to Comparative Example 16 was prepared using the same method as that of Comparative Example 15, except that a glass mask where the occupied area S2 of the non-conduction portion 12 was more than that of Comparative Example 15 was used. In the external connection terminal, the ratio x of the occupied area S2 of the non-conduction portion 12 to the occupied area S1 of the conduction portion 11 was 0.28. In addition, the ratio y of the height H2 of the non-conduction portion 12 to the height H1 of the conduction portion 11 was 2.00.

For the external connection terminals according to Examples 1 to 30 and Comparative Examples 1 to 16 prepared as described above, a spark failure incidence ratio was evaluated as follows.

Evaluation of Spark Failure Incidence Ratio 200 substrates where the external connection terminals were formed were caused to overlap each other, and one day was elapsed in this state. Next, the substrates were taken out one by one, and a resistance value between opposite end portions of the external connection terminal was measured. In this case, a substrate including at least one portion where the resistance value was not able to be measured (was overloaded) was determined as a substrate having a conduction failure, and a ratio of the substrates having a conduction failure to all of the 200 substrates was calculated as a spark failure incidence ratio. In this case, in a case where the spark failure incidence ratio was 2.0% or less, it was determined that spark failure in the external connection terminal was sufficiently suppressed. In a case where the spark failure incidence ratio was 1.0% or less, it was determined that spark failure in the external connection terminal was extremely suppressed. In addition, in a case where the spark failure incidence ratio was more than 2.0%, it was determined that spark failure was likely to occur.

Table 1 below shows the evaluation results of the spark failure incidence ratio for Examples 1 to 30, and Table 2 shows the evaluation results of the spark failure incidence ratio for Comparative Examples 1 to 16.

TABLE 1

| | Reference Diagram | Height H1 of Conduction Portion [μm] | Height H2 of Non-Conduction Portion [μm] | Material of Non-Conduction Portion | Ratio x between Occupied Areas | Ratio y between Heights | Spark Failure Incidence Ratio |
|---|---|---|---|---|---|---|---|
| Example 1 | FIG. 2 | 1.25 | 1.25 | Including Metal | 0.50 | 1.00 | 1.9% |
| Example 2 | FIG. 2 | 1.25 | 1.25 | Including Metal | 0.75 | 1.00 | 1.6% |
| Example 3 | FIG. 2 | 1.25 | 1.25 | Including Metal | 1.00 | 1.00 | 1.3% |
| Example 4 | FIG. 2 | 1.25 | 1.25 | Including Metal | 1.25 | 1.00 | 1.1% |
| Example 5 | FIG. 2 | 1.25 | 1.25 | Including Metal | 1.50 | 1.00 | 0.9% |
| Example 6 | FIG. 2 | 1.25 | 1.31 | Including Metal | 0.40 | 1.05 | 1.9% |
| Example 7 | FIG. 2 | 1.25 | 1.31 | Including Metal | 0.48 | 1.05 | 1.8% |
| Example 8 | FIG. 2 | 1.25 | 1.31 | Including Metal | 1.00 | 1.05 | 1.2% |
| Example 9 | FIG. 2 | 1.25 | 1.31 | Including Metal | 1.25 | 1.05 | 0.9% |
| Example 10 | FIG. 2 | 1.25 | 1.36 | Including Metal | 0.40 | 1.09 | 1.8% |
| Example 11 | FIG. 2 | 1.25 | 1.36 | Including Metal | 1.00 | 1.09 | 1.1% |
| Example 12 | FIG. 2 | 1.25 | 1.36 | Including Metal | 1.25 | 1.09 | 0.9% |
| Example 13 | FIG. 2 | 1.25 | 1.38 | Including Metal | 0.30 | 1.10 | 1.9% |
| Example 14 | FIG. 2 | 1.25 | 1.38 | Including Metal | 0.75 | 1.10 | 1.3% |
| Example 15 | FIG. 2 | 1.25 | 1.38 | Including Metal | 1.00 | 1.10 | 1.1% |
| Example 16 | FIG. 2 | 1.25 | 1.38 | Including Metal | 1.25 | 1.10 | 0.9% |
| Example 17 | FIG. 2 | 1.25 | 1.63 | Including Metal | 0.50 | 1.30 | 1.5% |
| Example 18 | FIG. 2 | 1.25 | 1.63 | Including Metal | 0.75 | 1.30 | 1.0% |
| Example 19 | FIG. 2 | 1.25 | 1.63 | Including Metal | 1.00 | 1.30 | 0.9% |
| Example 20 | FIG. 2 | 1.25 | 2.00 | Including Metal | 0.30 | 1.60 | 1.9% |
| Example 21 | FIG. 2 | 1.25 | 2.00 | Including Metal | 0.50 | 1.60 | 1.5% |
| Example 22 | FIG. 2 | 1.25 | 2.00 | Including Metal | 1.00 | 1.60 | 1.0% |
| Example 23 | FIG. 2 | 1.25 | 2.00 | Including Metal | 1.50 | 1.60 | 0.2% |
| Example 24 | FIG. 2 | 1.25 | 2.50 | Including Metal | 0.30 | 2.00 | 1.8% |
| Example 25 | FIG. 2 | 1.25 | 2.50 | Including Metal | 0.50 | 2.00 | 1.5% |
| Example 26 | FIG. 2 | 1.25 | 2.50 | Including Metal | 0.75 | 2.00 | 1.0% |
| Example 27 | FIG. 2 | 1.25 | 2.50 | Including Metal | 1.50 | 2.00 | 0.1% |

TABLE 1-continued

| | Reference Diagram | Height H1 of Conduction Portion [μm] | Height H2 of Non-Conduction Portion [μm] | Material of Non-Conduction Portion | Ratio x between Occupied Areas | Ratio y between Heights | Spark Failure Incidence Ratio |
|---|---|---|---|---|---|---|---|
| Example 28 | FIG. 4 | 1.25 | 2.00 | Including Metal | 1.60 | 1.60 | 0.1% |
| Example 29 | FIG. 6 | 1.25 | 2.00 | Including Metal | 0.75 | 1.60 | 1.0% |
| Example 30 | FIG. 8 | 1.25 | 2.00 | Including Metal | 1.50 | 1.60 | 0.1% |

TABLE 2

| | Reference Diagram | Height H1 of Conduction Portion [μm] | Height H2 of Non-Conduction Portion [μm] | Material of Non-Conduction Portion | Ratio x between Occupied Areas | Ratio y between Heights | Spark Failure Incidence Ratio |
|---|---|---|---|---|---|---|---|
| Comparative Example 1 | FIG. 11 | 2.00 | — | — | 0.00 | — | 11.5% |
| Comparative Example 2 | FIG. 12 | 2.00 | — | — | 0.00 | — | 8.0% |
| Comparative Example 3 | FIG. 13 | 1.25 | — | — | 0.00 | — | 6.0% |
| Comparative Example 4 | FIG. 2 | 1.25 | 2.00 | Resin | 0.92 | 1.60 | 3.2% |
| Comparative Example 5 | FIG. 14 | 1.25 | 1.25 | Including Metal | 0.30 | 1.00 | 3.5% |
| Comparative Example 6 | FIG. 14 | 1.25 | 1.25 | Including Metal | 0.48 | 1.00 | 2.1% |
| Comparative Example 7 | FIG. 14 | 1.25 | 1.31 | Including Metal | 0.20 | 1.05 | 3.9% |
| Comparative Example 8 | FIG. 14 | 1.25 | 1.31 | Including Metal | 0.30 | 1.05 | 2.2% |
| Comparative Example 9 | FIG. 14 | 1.25 | 1.36 | Including Metal | 0.20 | 1.09 | 3.5% |
| Comparative Example 10 | FIG. 14 | 1.25 | 1.36 | Including Metal | 0.28 | 1.09 | 2.2% |
| Comparative Example 11 | FIG. 14 | 1.25 | 1.38 | Including Metal | 0.20 | 1.10 | 3.0% |
| Comparative Example 12 | FIG. 14 | 1.25 | 1.38 | Including Metal | 0.28 | 1.10 | 2.2% |
| Comparative Example 13 | FIG. 14 | 1.25 | 2.00 | Including Metal | 0.20 | 1.60 | 3.0% |
| Comparative Example 14 | FIG. 14 | 1.25 | 2.00 | Including Metal | 0.28 | 1.60 | 2.2% |
| Comparative Example 15 | FIG. 14 | 1.25 | 2.50 | Including Metal | 0.20 | 2.00 | 2.9% |
| Comparative Example 16 | FIG. 14 | 1.25 | 2.50 | Including Metal | 0.28 | 2.00 | 2.1% |

As shown in Table 1, it can be seen that, in Examples 1 to 30, all the spark failure incidence ratios were 2.0% or less, and spark failure in the external connection terminal was sufficiently suppressed. Here, in all of Examples 1 to 30, the ratio x and the ratio y simultaneously satisfied Inequalities (1), (2), and (3). Therefore, it can be seen that, in a case where the ratio x and the ratio y simultaneously satisfy Inequalities (1), (2), and (3), spark failure is sufficiently suppressed.

It can be seen that, in Examples 5, 12, 16, 18, 19, 22, 23, and 26 to 30, all the spark failure incidence ratios were 1.0% or less, and spark failure in the external connection terminal was extremely suppressed. Here, in all of Examples 5, 12, 16, 18, 19, 22, 23, and 26 to 30, the ratio x and the ratio y simultaneously satisfied Inequalities (2), (4), and (5). Therefore, it can be seen that, in a case where the ratio x and the ratio y simultaneously satisfy Inequalities (2), (4), and (5), spark failure in the external connection terminal is extremely suppressed.

It can be seen that, in Comparative Examples 1 to 16, all the spark failure incidence ratios were more than 2.0%, and spark failure in the external connection terminal was likely to occur.

The external connection terminals according to Comparative Examples 1 to 3 did not include the non-conduction portions, and thus the surface pressure applied to the conduction portions 11E, 11F, and 11G from the substrates overlapping the external connection terminals were large. Therefore, it is considered that, in a case where the substrates was peeled off, peeling charging was large, and spark failure in the external connection terminal was likely to occur.

The external connection terminal according to Comparative Example 4 had the non-conduction portion 12 formed of a resin. Therefore, in a case where a surface pressure was applied from the substrate overlapping the external connection terminal, the non-conduction portion 12 was crushed, and the surface pressure applied to the conduction portions 11E, 11F, and 11G from the substrates was large. Therefore, it was considered that spark failure in the external connection terminal was likely to occur.

In Comparative Examples 5 to 12, both of the ratio x and the ratio y did not satisfy Inequality (3). In addition, in Comparative Examples 13 to 16, both of the ratio x and the ratio y satisfied Inequalities (2) and 3 but did not satisfy Inequality (1). Therefore, it can be seen that in a case where Inequalities (1), (2), and (3) are not simultaneously satisfied, spark failure is likely to occur.

It can be seen from the above evaluation results that, in a case where the external connection terminal includes the conduction portion 11 and the non-conduction portion 12, the conduction portion 11 and the non-conduction portion 12 consist of a material including metal, and the ratio x and the ratio y simultaneously satisfy Inequalities (1), (2), and (3), spark failure in the external connection terminal can be suppressed.

Basically, the present invention is configured as described above. Hereinabove, the external connection terminal 1 according to the embodiment of the present invention has been described in detail. However, the present invention is not limited to the above-described embodiments, and various improvements or modifications can be made within a range not departing from the scope of the present invention.

EXPLANATION OF REFERENCES

- 1, 1A, 1B, 1C, 1D, 1E, 1F, 1G, 1H, 2: external connection terminal
- 11, 11A, 11B, 11C, 11D, 11E, 11F, 11G, 11H: conduction portion
- 12, 12A, 12B, 12C, 13C, 12D, 12H: non-conduction portion
- A: substrate
- A1: first surface
- A2: second surface
- B1, B2: detection electrode
- C1, C2: lead wire
- H1, H2: height
- Q: opening portion

What is claimed is:

1. An external connection terminal comprising:

a first portion that is electrically connected to an electronic circuit; and a second portion that is electrically isolated from the electronic circuit, wherein the first portion and the second portion consist of a material including metal, and a ratio x of an occupied area of the second portion to an occupied area of the first portion in a plan view and a ratio y of a height of the second portion to a height of the first portion simultaneously satisfy $$x \geq 0.30,$$

$$y \geq 1.00, \text{ and}$$

$$y \geq -0.50 \times x + 1.25.$$

2. The external connection terminal according to claim 1, wherein the ratio x and the ratio y simultaneously satisfy $$x \geq 0.75,\ y \geq 1.00, \text{ and}$$

$$y \geq -0.50 \times x + 1.675.$$

3. The external connection terminal according to claim 1, wherein the second portion consists of at least one pattern.

4. The external connection terminal according to claim 2, wherein the second portion consists of at least one pattern.

5. The external connection terminal according to claim 3, wherein the at least one pattern of the second portion is surrounded by the first portion.

6. The external connection terminal according to claim 4, wherein the at least one pattern of the second portion is surrounded by the first portion.

* * * * *